(12) United States Patent
Kim

(10) Patent No.: US 10,446,616 B2
(45) Date of Patent: Oct. 15, 2019

(54) TRANSPARENT ORGANIC LIGHT-EMITTING DISPLAY DEVICE

(71) Applicant: LG DISPLAY CO., LTD., Seoul (KR)

(72) Inventor: TaeHwan Kim, Goyang-si (KR)

(73) Assignee: LG DISPLAY CO., LTD., Seoul (KR)

( * ) Notice: Subject to any disclaimer, the term of this patent is extended or adjusted under 35 U.S.C. 154(b) by 14 days.

(21) Appl. No.: 15/320,245

(22) PCT Filed: Jun. 29, 2015

(86) PCT No.: PCT/KR2015/006661
§ 371 (c)(1),
(2) Date: Dec. 19, 2016

(87) PCT Pub. No.: WO2016/003141
PCT Pub. Date: Jan. 7, 2016

(65) Prior Publication Data
US 2017/0194390 A1    Jul. 6, 2017

(30) Foreign Application Priority Data

Jun. 30, 2014  (KR) ................. 10-2014-0080869

(51) Int. Cl.
*H01L 27/32*   (2006.01)
*H01L 51/52*   (2006.01)
*H01L 51/50*   (2006.01)

(52) U.S. Cl.
CPC ........ *H01L 27/3218* (2013.01); *H01L 27/322* (2013.01); *H01L 27/326* (2013.01);
(Continued)

(58) Field of Classification Search
CPC ............ H01L 27/3218; H01L 27/326; H01L 27/3213; H01L 27/322; H01L 27/3276; H01L 51/5218
(Continued)

(56) References Cited

U.S. PATENT DOCUMENTS 8,415,873 B2   4/2013  Kang et al.
8,629,463 B2   1/2014  Chung
(Continued)

FOREIGN PATENT DOCUMENTS

JP       2004117689 A      4/2004
KR    10-2011-0080384 A    7/2011
KR    10-2011-0100956 A    9/2011

*Primary Examiner* — Robert T Huber
(74) *Attorney, Agent, or Firm* — Dentons US LLP

(57) ABSTRACT

Disclosed herein is a transparent organic light-emitting display (OLED) device. A first sub-pixel includes a first transparent region and a first emissive region disposed in line with the first transparent region in a first direction, and a second sub-pixel includes a second transparent region area and a second emissive region in line with the second transparent region in the first direction. The second sub-pixel is disposed adjacent to the first sub-pixel in the second direction. The first emissive region is in line with the second transparent region in a second direction, and the second emissive region is in line with the first transparent region in the second direction. In the transparent OLED device according to an exemplary embodiment of the present disclosure, emissive regions are disposed in a zigzag pattern with respect to a gate line, so that the area of the transparent regions can be enlarged, and accordingly higher transmittance can be achieved.

13 Claims, 9 Drawing Sheets

(52) U.S. Cl.
CPC ...... *H01L 27/3213* (2013.01); *H01L 27/3276* (2013.01); *H01L 51/5012* (2013.01); *H01L 51/5218* (2013.01); *H01L 51/5221* (2013.01); *H01L 2251/5315* (2013.01)

(58) Field of Classification Search
USPC ...................................... 257/40, 89, E51.022
See application file for complete search history.

(56) References Cited

U.S. PATENT DOCUMENTS

| | | | |
|---|---|---|---|
| 9,117,402 B2* | 8/2015 | Lee | G09G 3/3208 |
| 2005/0162079 A1 | 7/2005 | Sakamoto | |
| 2012/0200555 A1* | 8/2012 | Omoto | H01L 27/322 345/212 |
| 2012/0267611 A1* | 10/2012 | Chung | H01L 27/3211 257/40 |
| 2013/0154910 A1 | 6/2013 | Chu et al. | |

* cited by examiner

| Type | COMPARATIVE EXAMPLE | EMBODIMENT |
|---|---|---|
| TRANSMISSION REGION APERTURE RATIO | 20% | 40% |
| LIGHT-EMITTING REGION APERTURE RATIO | 25% | 25% |
| PIXEL DIAGRAM | | |
| TRANSMITTANCE | 10% | 20% |

FIG. 5

TRANSPARENT ORGANIC LIGHT-EMITTING DISPLAY DEVICE

CROSS-REFERENCE TO RELATED APPLICATIONS

This application is a National Stage Application of International Application No. PCT/KR2015/006661, filed on Jun. 29, 2015, which claims the benefit of Korean Patent Application No. 10-2014-0080869 filed on Jun. 30, 2014, all of which are hereby incorporated by reference in their entirety for all purposes as if fully set forth herein.

BACKGROUND

Technical Field

The present disclosure relates to a transparent organic light-emitting display (OLED) device, and more particularly to a technique for improving transmittance of a top-emission OLED device including a transparent region and an emissive region.

Description of the Related Art

An organic light-emitting display device (OLED) is capable of producing light in its own and thus does not require an additional light source, unlike liquid crystal device (LCD). Also, an organic light-emitting display device can be produced as a thin, transparent display device using a transparent material. Further, an OLED device has advantages in that it is driven with low voltage to consume less power, and in that it represents vivid colors, has short response time, wide viewing angle and good contrast ratio (CR). For these reasons, an OLED device is currently under development as the next generation display device.

It is very important for securing a transparent OLED device to have high transmittance of the transparent OLED device. A top-emission transparent OLED device includes sub-pixel including an emissive region and a transparent region. Accordingly, in order to achieve high transmittance of the transparent OLED device, it is required to make the transparent region as large as possible.

Specifically, as an approach for achieving high transmittance of a transparent OLED device, it has been considered to reduce the area of a driving region included in an emissive region of a sub-pixel. However, since the driving region in a sub-pixel is designed to be optimized for characteristics of components, if the number and/or size of thin-film transistors or capacitors disposed in the driving region are reduced in order to reduce the area other driving region, the reliability of a transparent OLED device may be decreased.

As another approach, it has been considered to increase the area of a pixel in order to achieve high transmittance of a transparent OLED device. However, the area of a pixel of a transparent OLED device is determined based on the resolution of the transparent OLED device. In particular, for a transparent OLED device having high resolution, the area of a sub-pixel is especially small. Accordingly, the area of a pixel is inherently limited by the resolution of a transparent OLED device, and thus it is practically difficult to increase the area of the pixel to achieve high transmittance.

Incidentally, in a typical top-emission transparent OLED device, sub-pixels disposed next to each other have the emissive region disposed next to each other. However, in a top-emission transparent OLED device having such layout of emissive regions, a gap is required between emissive regions of sub-pixels as a process margin. For example, if a transparent OLED device uses red organic emission layers, green organic emission layers and blue organic emission layers to display images, a process of forming the organic emission layers is carried out using a fine metal mask (FMM) so that they are formed in a regular distance. The process is to avoid the organic emission layers from overlapping one another or to avoid the organic emission layers from being formed at undesirable locations. In addition, if a transparent OLED device uses white organic emission layers and a color filter to display images, a certain distance is required during a process of attaching an upper substrate to a lower substrate. In particular, if emissive regions are disposed in line with one another, a process margin is made on two sides of an emissive region. Accordingly, the area of process margins which can be utilized as neither an emissive region nor a transparent region increases. As a result, the area of the emissive regions and transparent regions in sub-pixels are reduced. That is, if emissive regions are disposed in line and next to one another, the area of transparent regions is reduced due to process margins between emissive regions. Also, the aperture ratio of the transparent regions and the transmittance of a transparent OLED device may be reduced.

SUMMARY

The inventors of the application have been devised a transparent OLED device having a novel structure capable of increasing transmittance by modifying the layout of emissive regions.

In view of the above, an object of the present disclosure is to provide a transparent OLED device with an increased aperture ratio of transparent regions while minimizing the area occupied by lines in the transparent regions in pixels by modifying the layout of the emissive regions in the pixel.

Another object of the present disclosure is to provide a transparent OLED device capable of achieving as large transmittance as possible while maintaining the resolution of the transparent OLED device by disposing emissive regions in sub-pixels such that a process margin between emissive regions is minimized.

It should be noted that objects of the present disclosure are not limited to the above-described objects, and other objects of the present disclosure will be apparent to those skilled in the art from the following descriptions.

According to an aspect of the present disclosure, there is provided a transparent organic light-emitting display (OLED) display. A first sub-pixel includes a first transparent region and a first emissive region in line with the first transparent region in a first direction, and a second sub-pixel includes a second transparent region and a second emissive region in line with the second transparent region in a second direction. The second transparent region is disposed adjacent to the first sub-pixel in the second direction. The first emissive region is disposed in line with the second transparent region in the second direction, and the second emissive region is disposed in line with the first transparent region in the second direction. In the transparent OLED device according to the aspect of the present disclosure, emissive regions are disposed in a zigzag pattern with respect to a gate line, so that the area of the transparent regions can be enlarged, and higher transmittance can be achieved accordingly.

The transparent OLED device may further include a gate line disposed overlapping a part of the first emissive region and a part of the second emissive region and extended in the second direction.

The gate line may include a first portion overlapping a lower end of the first emissive region and an upper end of the second emissive region and extended in the second direction, and a second portion extended in the first direction.

The second portion of the gate line may overlap a data line disposed between the first sub-pixel and the second sub-pixel and be extended along with it.

Areas of the first transparent region and the second transparent region may be equal to or more than 25% of areas of the first sub-pixel and the second sub-pixel, respectively.

The first transparent region and the second transparent region may be disposed on opposite sides with respect to a virtual straight line passing a center of the first sub-pixel and a center of the second sub-pixel in the second direction.

According to another aspect of the present disclosure, there is provided a transparent OLED device. A transparent OLED includes a plurality of pixels. Each of the plurality of pixels includes a plurality of sub-pixels. Each of the plurality of sub-pixels may be divided into an emissive region and a transparent region, and at least one of red, green, blue and white colors may be emitted from the emissive region, and external light coming from outside the transparent OLED device is transmitted through the transparent region. The emissive region may be surrounded by the transparent region of that pixel and transparent regions of adjacent sub-pixels. In the transparent OLED device according to the aspect of the present disclosure, emissive regions are disposed in a zigzag pattern so that the emissive regions of a sub-pixel are not adjacent to each other, and the emissive regions overlap a data line and a gate line at the same time. As a result, the transparent region in each of sub-pixels can be maximized, and thus the transmittance can be improved.

In the emissive region, a thin-film transistor; and an organic light-emitting element including an anode, an organic emission layer and a cathode may be disposed.

The anode may include a reflective layer and a transparent conductive layer on the reflective layer.

The transparent OLED may further include: a gate line disposed such that the gate line overlaps the anode.

The emissive region may be spaced apart from an emissive region of an adjacent sub-pixel by a distance required to avoid color mixing with light emitted from the emissive region of the adjacent sub-pixel.

The emissive region may have a chamfered shape for suppressing color mixing.

The transparent OLED device may further include: a data line disposed between the sub-pixel and the adjacent sub-pixel, and a side of the emissive region may have a protruding portion that overlaps the data line and protrudes outwardly.

The organic emission layer disposed in the emissive region may be one of a red organic emission layer, a green organic emission layer and a blue organic emission layer, and the distance may be determined based on a process margin required during a process of forming the organic emission layer.

The organic emission layer disposed in the emissive region may be a white organic emission layer, and the device may further include a color filter formed above the emissive region, and the distance may be determined based on a process margin required during a process of forming the color filter.

Particulars in the exemplary embodiments of the present disclosure will be described in the detail description with reference to the accompanying drawings.

According to embodiments of the present disclosure, by altering the layout of emissive regions in pixels, the aperture ratio of transparent regions and in turn the transmittance of a transparent OLED device can be increased.

In addition, by disposing emissive regions such that they overlap an area where lines are formed in a transparent OLED device, the area of transparent regions can be increased while the area of the emissive regions is maintained.

It should be noted that effects of the present disclosure are not limited to those described above and other effects of the present disclosure will be apparent to those skilled in the art from the following descriptions.

BRIEF DESCRIPTION OF THE DRAWINGS

The above and other aspects, features and other advantages of the present disclosure will be more clearly understood from the following detailed description taken in conjunction with the accompanying drawings, in which:

FIG. 5 is a table showing results of comparing the transmittance of a transparent OLED device according to an exemplary embodiment of the present disclosure with the transmittance of an existing OLED device;

DETAILED DESCRIPTION OF THE PREFERRED EMBODIMENT

Figure 1:
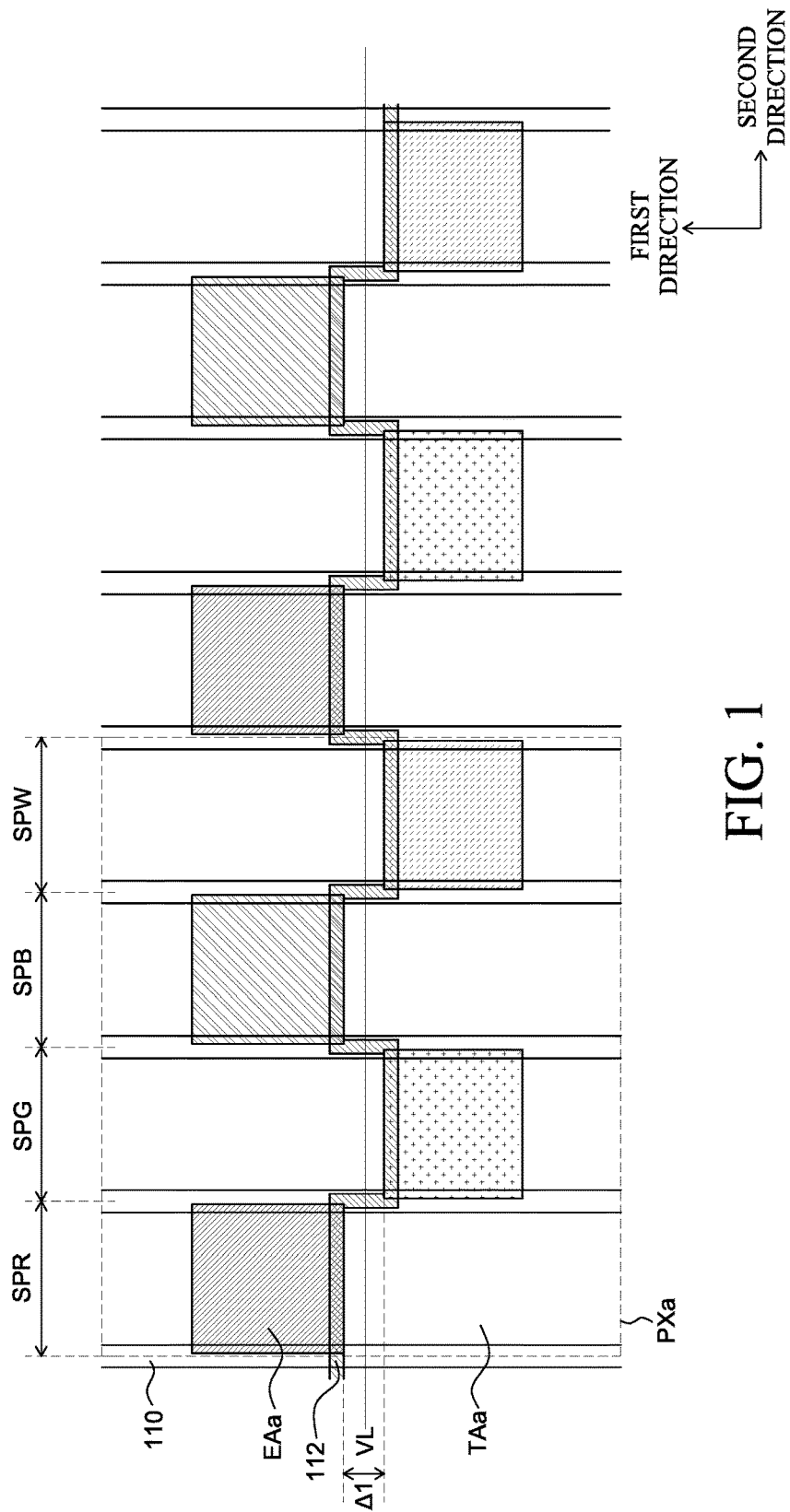
FIG. 1 is a schematic plan view for illustrating a plurality of sub-pixels in a transparent OLED device according to an exemplary embodiment of the present disclosure.

Advantages and features of the present disclosure and methods to achieve them will become apparent from the descriptions of exemplary embodiments herein below with reference to the accompanying drawings. However, the present disclosure is not limited to exemplary embodiments disclosed herein but may be implemented in various different ways. The exemplary embodiments are provided for making the disclosure of the present disclosure thorough and for fully conveying the scope of the present disclosure to those skilled in the art. It is to be noted that the scope of the present disclosure is defined only by the claims.

The figures, dimensions, ratios, angles, numbers of elements given in the drawings are merely illustrative and are not limiting. Further, in describing the present disclosure, descriptions on well-known technologies may be omitted in order not to obscure the gist of the present disclosure. It is to be noticed that the terms "comprising," "having," "including" and so on, used in the description and claims, should not be interpreted as being restricted to the means listed thereafter unless specifically stated otherwise. Where an indefinite or definite article is used when referring to a singular noun, e.g. "a," "an," "the," this includes a plural of that noun unless specifically stated otherwise.

In describing elements, they are interpreted as including error margins even without explicit statements.

In describing positional relationship, such as "an element A on an element B," "an element A above an element B," "an element A below an element $B_i$," and "an element A next to an element B," another element C may be disposed between the elements A and B unless the term "directly" or "immediately" is explicitly used.

As used herein, a phrase "an element A on an element B" refers to that the element A may be disposed directly on the element B and/or the element A may be disposed indirectly on the element B via another element C.

The terms first, second, third and the like in the descriptions and in the claims are used for distinguishing between similar elements and not necessarily for describing a sequential or chronological order. Theses terms are used to merely distinguish one element from another. Accordingly, as used herein, a first element may be a second element within the technical idea of the present disclosure.

Like reference numerals denote like elements throughout the descriptions.

The drawings are not to scale and the relative dimensions of various elements in the drawings are depicted schematically and not necessarily to scale.

Features of various exemplary embodiments of the present disclosure may be combined partially or totally. As will be clearly appreciated by those skilled in the art, technically various interactions and operations are possible. Various exemplary embodiments can be practiced individually or in combination.

Hereinafter, various exemplary embodiments of the present disclosure will be described in detail with reference to the accompanying drawings.

FIG. 1 is a schematic plan view for illustrating a plurality of sub-pixels in a transparent OLED device according to an exemplary embodiment of the present disclosure. Referring to FIG. 1, the transparent OLED device includes a pixel region PXa including a plurality of sub-pixels SPR, SPG, SPB and SPW.

Each of the sub-pixels SPR, SPG, SPB and SPW is a basic light-emission unit of the pixel region PXa. Each of the sub-pixels SPR, SPG, SPB and SPW forming the pixel region PXa emit lights of different colors. Specifically, the single pixel region PXa includes four sub-pixels, i.e., a red light emitting sub-pixel SPR, a green light emitting sub-pixel SPG, a blue light emitting sub-pixel SPB, and a white light emitting sub-pixel SPW. Each of the sub-pixels SPR, SPG, SPB and SPW includes an emissive region EAa and a transparent region TAa.

The emissive region EAa in each of the sub-pixels SPR, SPG, SPB and SPW is an area where light is emitted. The emissive area EAa emits light of at least one of red, green, blue and white colors. In the emissive region EAa, an organic light-emitting element and a thin-film transistor are formed. Referring to FIG. 1, the emissive regions EAa are disposed in a zigzag pattern with respect to a virtual straight line VL extended in the same direction as the gate line 112 is extended. The transparent region TAa refers to an area that does not transmit light emitted from the emissive region EAa but allows the background of the device to be seen. That is, the transparent region TAa may transmit external light and accordingly the transparent OLED device may have transparency. The layout and shape of the emissive region EAa and the transparent area TAa will be described in detail with reference to FIG. 2.

Referring to FIG. 1, the transparent region TAa in each of the sub-pixels SPR, SPG, SPB and SPW is an area where light is transmitted. The transparent region TAa allows light incident on the transparent OLED device to pass through it to make the OLED device look transparent. The transparent region TAa is in contact with the light-emitting area EAa. As the emissive regions EAa are disposed in a zigzag pattern with respect to the virtual straight line VL, the transparent region TAa is also disposed in a zigzag pattern with respect to the virtual straight line VL. In addition, the emissive region EAa may be surrounded by the transparent area TAa of that pixel and transparent areas TAa of adjacent sub-pixels.

The gate line 112 is electrically connected to each of the sub-pixels SPR, SPG, SPB and SPW. Specifically, the gate line 112 is electrically connected to the emissive region EAa in each of the sub-pixels SPR, SPG, SPB and SPW, and is in turn electrically connected to the thin-film transistors formed in the respective emissive regions EAa. That is, the gate line 112 may overlap the emissive regions EAa to be electrically connected to the emissive regions EAa.

In addition, the emissive regions EAa in the sub-pixels SPR, SPG, SPB and SPW may be spaced apart from one another above or below the virtual straight line VL. Specifically, the emissive regions EAa in the sub-pixels SPR, SPG, SPB and SPW may be spaced apart from one another by a predetermined distance above the virtual straight line VL and may be spaced apart from one another by a predetermined distance below the virtual straight line VL as well. The predetermined distance may be determined so that the light emitted from a sub-pixel is not mixed with light emitted from an adjacent sub-pixel. For example, the predetermined distance may be a width of an adjacent sub-pixel and may be adjusted depending on the shape of the emissive region EAa. For example, the emissive region EAa of the red sub-pixel SPR may be located above the virtual straight line VL and the emissive area EAa of the green sub-pixel SPG adjacent to the red sub-pixel SPR may be located below the virtual straight line VL. The emissive region EAa of the blue sub-pixel SPB adjacent to the green sub-pixel SPG may be spaced apart from the emissive region EAa of the red sub-pixel SPR by a width of the green sub-pixel SPG and located above the virtual straight line VL. Likewise, the emissive region EAa of the white sub-pixel SPW adjacent to the blue sub-pixel SPB may be spaced apart from the emissive region EAa of the green sub-pixel SPG by a width of the blue sub-pixel SPB and located below the virtual straight line VL. The spacing between the emissive regions EAa depending on the shape of the emissive regions EAa will be described in detail below with reference to FIG. 2.

In addition, the emissive regions may be staggered alternately with respect to the virtual straight line VL. Specifically, a straight line connecting the center of mass of an emissive region EAa with the center of mass of adjacent emissive region EAa may form an intersection point on the virtual straight line VL. That is, a series of lines connecting the centers of mass of the emissive regions EAa may be expressed as a sawtooth shape.

Referring to FIG. 1, the gate line 112 is extended in a second direction, i.e., the direction in which the virtual straight line VL is extended. Specifically, the gate line 112 has a square waveform shape along the direction in which the virtual straight line VL is extended.

The data line 110 is electrically connected to each of the sub-pixels SPR, SPG, SPB and SPW. Specifically, the data line 110 is electrically connected to the emissive region EAa in each of the sub-pixels SPR, SPG, SPB and SPW, and is in turn electrically connected to the thin-film transistors formed in the respective emissive regions EAa. That is, the data line 110 may overlap the emissive regions EAa to be electrically connected to the emissive regions EAa.

The data line 110 is extended in a direction different from the direction in which the gate line 112 is extended. For example, the data line 110 may be extended in a second direction perpendicular to the direction in which the gate line 112 is extended. In addition, the data line 110 may be disposed between two sub-pixels SPR, SPG, SPB and SPW.

Referring to FIG. 1, the first direction refers to the direction in which the data line is extended, and the second direction refers to the direction in which the virtual straight line VL is extended. The first direction and the second direction may be perpendicular to each other. The first direction and the second direction are equally applied throughout the drawings.

The sub-pixels will be described in more detail with reference to FIG. 2.

Figure 2:
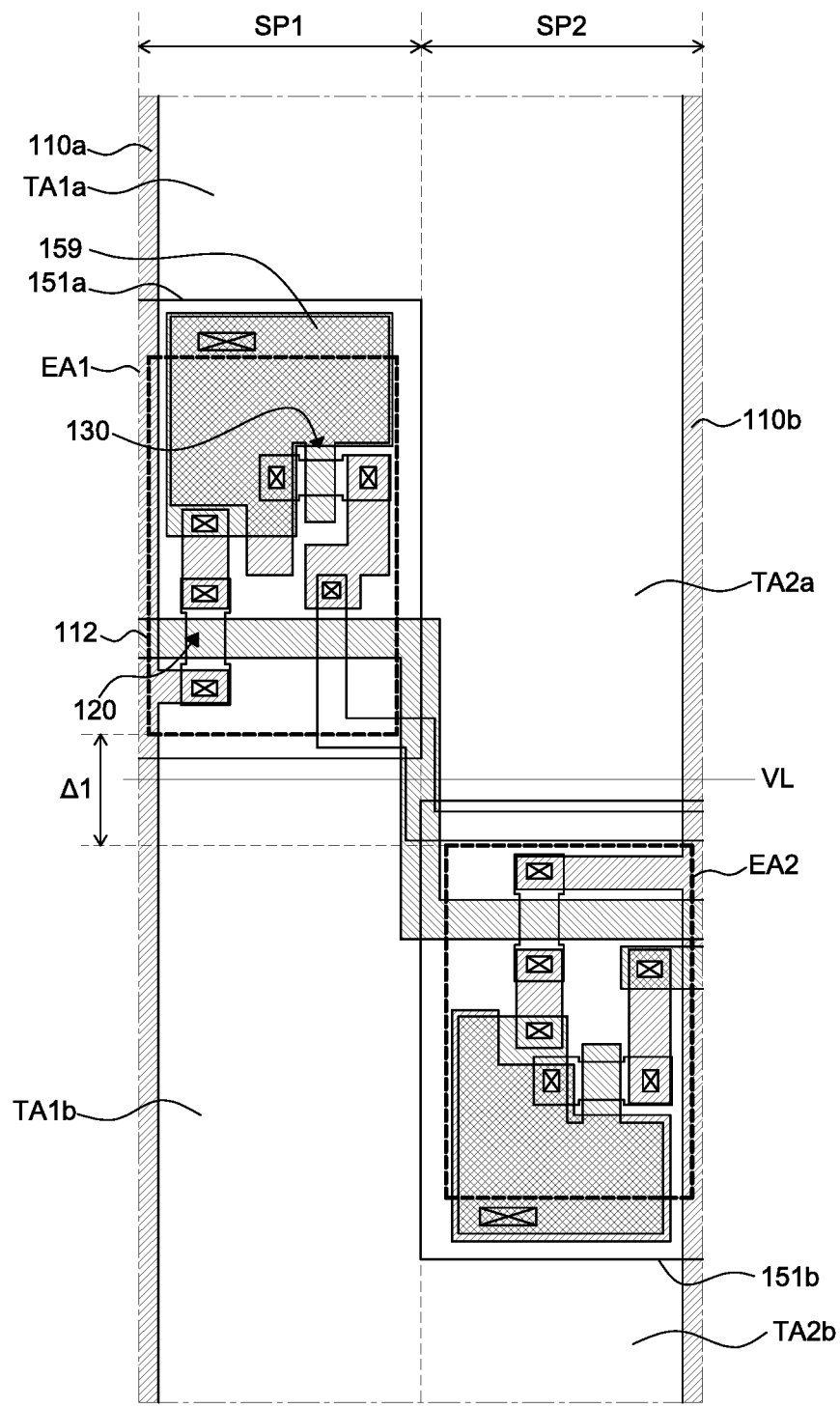
FIG. 2 is a plan view for illustrating two sub-pixels in a transparent OLED device according to an exemplary embodiment of the present disclosure.

FIG. 2 is a schematic plan view for illustrating two sub-pixels in a transparent OLED device according to an exemplary embodiment of the present disclosure. FIG. 2 is an enlarged view of a first sub-pixel SP1 and a second sub-pixel SP2 adjacent to each other among the plurality of sub-pixels SPR, SPG, SPB and SPW shown in FIG. 1. Detailed description of the substantially identical elements will be omitted to avoid redundancy. For convenience of illustration, FIG. 2 only shows the gate line 112, the data lines 110a and 110b, a switching thin-film transistor 120, a driving thin-film transistor 130 and a capacitor 159 and anodes 151a and 151b included in the transparent OLED device.

Referring to FIG. 2, the first sub-pixel SP1 includes a first transparent region TA1a and a first emissive region EA1 in line with the first transparent region TA1a in the first direction. The second sub-pixel SP2 includes a second transparent region TA2b and a second emissive region EA2 in line with the second transparent region TA2b in the first direction, and is adjacent to the first sub-pixel SP1 in the second direction. The first emissive region EA1 is in line with the first transparent region TA2a in the second direction, and the second emissive region EA2 is in line with the second transparent region TA1b in the second direction.

Specifically, the first sub-pixel SP1 is configured to include a first transparent region TA1a on the upper side of the emissive region EA1 and a second transparent region TA1b on the lower side of the emissive region EA1. That is, in the first sub-pixel SP1, the emissive region EA1 is disposed between the first transparent region TA1a and the second transparent region TA1b. In other words, the first transparent region TA1a is disposed adjacent to an upper side defining the emissive region EA1, and the second transparent region TA1b is disposed adjacent to a lower side defining the emissive region EA1. Similar to the first sub-pixel SP1, the second sub-pixel SP2 is configured to include a first transparent region TA2a and a second transparent region TA2b on the upper and lower parts of the emissive region EA2, respectively. Like the emissive region EA1 in the first sub-pixel SP1, the emissive region EA2 in the second sub-pixel SP2 is disposed between the first transparent region TA2a and the second transparent region TA2b. In other words, the first transparent region TA2a is disposed adjacent to an upper side defining the emissive region EA2, and the second transparent region TA2b is disposed adjacent to a lower side defining the emissive region EA2.

Referring to FIG. 2, the emissive region EA1 of the first sub-pixel SP1 is disposed above the virtual straight line VL in the first sub-pixel SP1 and the emissive region EA2 of the second sub-pixel SP2 is disposed below the virtual straight line VL in the second sub-pixel SP2. Accordingly, the emissive region EA1 of the first sub-pixel SP1 and the emissive region EA2 of the second sub-pixel SP2 are alternately staggered with respect to the virtual straight line VL.

The emissive region EA1 of the first sub-pixel SP1 and the emissive region EA2 of the second sub-pixel SP2 overlap the gate line 112. As the emissive region EA1 of the first sub-pixel SP1 and the emissive region EA2 of the second sub-pixel SP2 overlap the gate line 112, the gate line 112 passes through the emissive region EA1 of the first sub-pixel SP1 and the emissive region EA2 of the second sub-pixel SP2. That is, the gate line 112 is extended in the second direction such that it overlaps a part of the first emissive region EA1 and a part of the second emissive region EA2. Further, the gate line 112 may overlap a lower end of the first emissive region EA1 and an upper end of the second emissive region EA2 and may include a portion extended in the second direction and a portion extended in the first direction.

The emissive region EA1 of the first sub-pixel SP1 and the emissive region EA2 of the second sub-pixel SP2 also overlap the data lines 110a and 110b, respectively, allowing the size of emissive regions EA1 and EA2 to be maximized. Specifically, the emissive region EA1 of the first sub-pixel SP1 overlaps the data line 110a along the direction in which the data lines 110a and 110b are extended. In addition, the emissive region EA2 of the second sub-pixel SP2 overlaps the data line 110b along the direction in which the data lines 110a and 110b are extended.

The emissive region EA1 of the first sub-pixel SP1 and the emissive region EA2 of the second sub-pixel SP2 may be defined by a bank layer. Specifically, the emissive region EA1 of the first sub-pixel SP1 and the emissive region EA2 of the second sub-pixel SP2 are areas which are not covered by the bank layer. An area of the first anode 151a formed in the first sub-pixel SP1 which is not covered by the bank layer is defined as the emissive region EA1 of the first sub-pixel SP1. An area of the second anode 151b formed in the second sub-pixel SP2 which is not covered by the bank layer is defined as the emissive region EA2 of the second sub-pixel SP2.

The emissive region EA1 of the first sub-pixel SP1 and the emissive region EA2 of the second sub-pixel SP2 are spaced apart from each other in the vertical direction by a vertical gap Δ1. The vertical gap Δ1 refers to a minimum distance between emissive regions of adjacent sub-pixels necessary for avoiding color mixing. Referring to FIG. 2, the vertical gap Δ1 is the distance between the lower end of the emissive region EA1 of the first sub-pixel SP1 and the upper end of the emissive region EA2 of the second sub-pixel SP2, which is a sum of the shortest distance from the virtual straight line VL to the emissive region EA1 of the first sub-pixel SP1 and the shortest distance from the virtual straight line VL to the emissive region EA2 of the second sub-pixel SP2, respectively. Specifically, the vertical gap Δ1 is the shortest distance between a line extended from the lower end of the emissive region EA1 of the first sub-pixel SP1 in parallel to the virtual straight line VL and a line extended from the upper end of the emissive region EA2 of the second sub-pixel SP2 in parallel to the virtual straight line VL.

The vertical gap Δ1 is determined based on a process margin required during the manufacturing a transparent OLED device. Specifically, in a transparent OLED device including red, green, blue and white emissive regions, the process margin is determined based on a margin necessary for attaching an upper substrate to a lower substrate and a margin necessary for forming red, green or blue color filters to fit the emissive regions EA1 and EA2.

The shape of the gate line 112 can be more similar to a straight line, as the vertical gap Δ1 between the emissive region EA1 of the first sub-pixel SP1 and the emissive region EA2 of the second sub-pixel SP2 decreases. For example, the shape of the gate line 112 may be a substantially straight line if the vertical gap Δ1 decreases so that the emissive region EA1 of the first sub-pixel SP1 and the emissive region EA2 of the second sub-pixel SP2 come in direct contact with the gate line 112.

Referring to FIG. 2, in each of the emissive region EA1 of the first sub-pixel SP1 and the emissive region EA2 of the second sub-pixel SP2, a switching thin-film transistor 120, a driving thin-film transistor 130 and a capacitor 159 are formed. Although two thin-film transistors and one capacitor are formed in each of the sub-pixels SP1 and SP2 in FIG. 2, this is merely illustrative. The numbers of the thin-film transistors and capacitors included in each of sub-pixels SP1 and SP2 may vary. It is to be noted that the thin-film transistors and the capacitors are all formed in each of the emissive region EA1 of the first sub-pixel SP1 and the emissive region EA2 of the second sub-pixel SP2.

Referring to FIG. 2, the first transparent region TA1a of the first sub-pixel SP1 is disposed on the upper side of the emissive region EA1 of the first sub-pixel SP1, and the second transparent region TA1b of the first sub-pixel SP1 is disposed on the lower side of the emissive region EA1 of the first sub-pixel SP1. In addition, the first transparent region TA2a of the second sub-pixel SP2 is disposed on the upper side of the emissive region EA2 of the second sub-pixel SP2, and the second transparent region TA2b of the second sub-pixel SP2 is disposed on the lower side of the emissive region EA2 of the second sub-pixel SP2. As the emissive region EA1 of the first sub-pixel SP1 and the emissive region EA2 of the second sub-pixel SP2 are alternately staggered, the second transparent region TA1b of the first sub-pixel SP1 and the first transparent region TA2a of the second sub-pixel SP2 are also alternately staggered with respect to the virtual straight line VL. Similarly, the first transparent region TA1a of the first sub-pixel SP1 and the second transparent region TA2b of the second sub-pixel SP2 are also alternately staggered with respect to the virtual straight line VL.

Referring to FIG. 2, the first sub-pixel SP1 and the second sub-pixel SP2 constitute a unit structure for forming a single pixel, and may be defined variously. Specifically, a single sub-pixel may include one emissive region and two transparent regions. For example, the first sub-pixel SP1 includes the emissive region EA1 of the first sub-pixel SP1, the first transparent region TA1a of the first sub-pixel SP1, and the second transparent region TA1b of the first sub-pixel SP1. More specifically, one sub-pixel may include one emissive region and one transparent region. For example, the first sub-pixel SP1 may include the emissive region EA1 of the first sub-pixel SP1 and the first transparent region TA1a of the first sub-pixel SP1 or may include the emissive region EA1 of the first sub-pixel SP1 and the second transparent region TA1b of the first sub-pixel SP1. That is, although the single first sub-pixel SP1 includes both the first transparent region TA1a of the first sub-pixel SP1 and the second transparent region TA1b of the first sub-pixel SP1 in FIG. 2, the first sub-pixel SP1 may include only one of the first transparent region TA1a of the first sub-pixel SP1 and the second transparent region TA1b of the first sub-pixel SP1.

Hereinafter, elements formed in each of the first sub-pixel SP1 and the second sub-pixel SP2 will be described in more detail with reference to FIG. 3.

Figure 3:
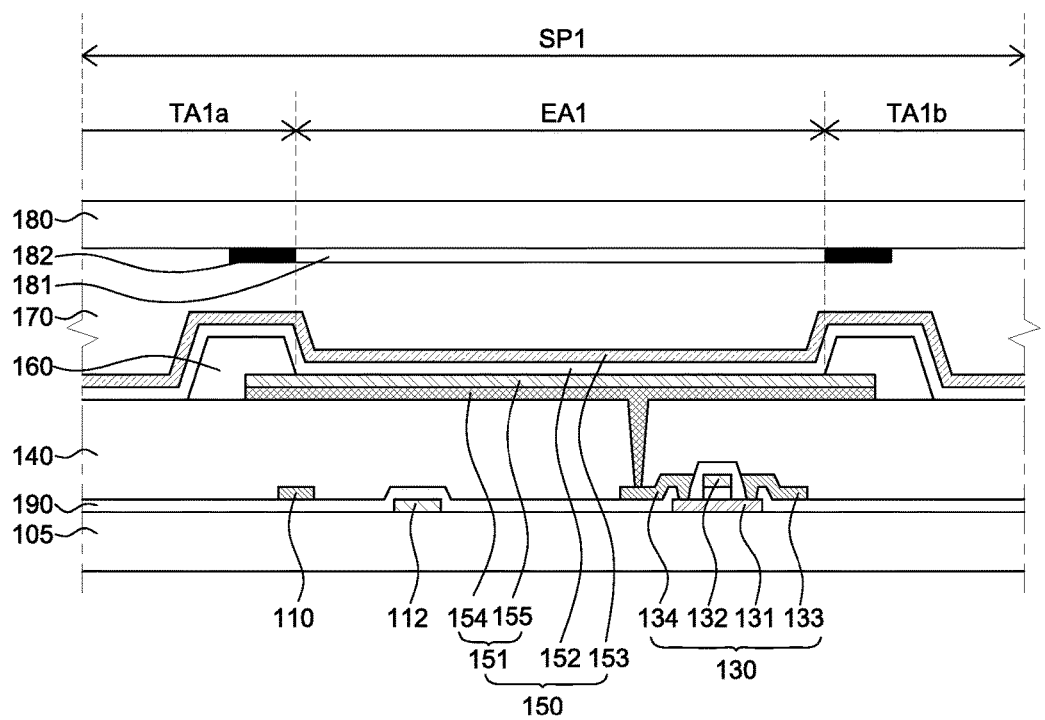
FIG. 3 is a schematic cross-sectional view of a transparent OLED device according to an exemplary embodiment of the present disclosure.

FIG. 3 is a schematic cross-sectional view of a transparent OLED device according to an exemplary embodiment of the present disclosure. FIG. 3 schematically shows the first sub-pixel SP1 of the first sub-pixel SP1 and the second sub-pixel SP2 shown in FIG. 2. Detailed description of the substantially identical elements will be omitted to avoid redundancy. In FIG. 3, the switching thin-film transistor 120 and the capacitor 159 are not depicted for brevity.

Referring to FIG. 3, the data line 110, the gate line 112, the driving thin-film transistor 130, an organic light-emitting element 150 and a color filter 181 are formed in the emissive region EA1.

The driving thin-film transistor 130 is formed on a lower substrate 105 in the emissive region EA1. The driving thin-film transistor 130 includes an active layer 131, a gate electrode 132, a source electrode 133 and a drain electrode 134. The drain electrode 134 is electrically connected to the anode 151. Although the drain electrode 134 is electrically connected to the anode 151 in FIG. 3, the source electrode 133 may be electrically connected to the anode instead.

The gate line 112 is formed on a part of the lower substrate 105 in the emissive region EA1. The gate line 112 is made of the same material as the gate electrode 132. The gate line 112 is covered by an interlayer insulating layer 190.

The data line 110 is formed on a part of the interlayer insulating layer 190 in the first transparent region TA1a. The data line 110 is made of the same material as the source electrode 133 and the drain electrode 134. The data line 110 is covered by an overcoat layer 140.

The organic light-emitting element 150 is formed on the overcoat layer 140 that flattens the upper surface of the driving thin-film transistor 130. The organic light-emitting element 150 includes an anode 151, an organic emission layer 152 and a cathode 153. In this example, the organic emission layer 152 emits light of white color. Since a transparent OLED device described herein is a top-emission transparent OLED device, the anode 151 may include a reflective layer 154 and a transparent conductive layer 155 on the reflective layer 154. The anode 151 is formed above the gate line 112 and the data line 110 such that it overlaps the gate line 112 and the data line 110.

The emissive region EA1 is defined by the bank layer 160. That is, as shown in FIG. 3, the emissive region EA1 is defined as the part of the anode 151 which is not covered by the bank layer 160.

As the transparent OLED device includes the organic emission layer 152 emitting light of white color, a color filter 181 and a black matrix 182 formed above a sealing element 170 are used. The color filter 181 and the black matrix 182 are formed on the bottom surface of the upper substrate 180. The color filter 181 may be formed larger than the emissive region EA1 as shown in FIG. 3 or may be formed to have the same size as the emissive region EA1. The color filter 181 is an element for converting white light generated from the organic light-emitting element 150 into red, green or blue light and may be one of a red color filter, a green color filter and a blue color filter. In the example of FIG. 3, the first sub-pixel SP1 is shown as one of a red sub-pixel, a green sub-pixel and a blue sub-pixel, and the color filter 181 is disposed on the upper substrate 180. However, if the first sub-pixel SP1 is a white sub-pixel, the color filter 181 may not be disposed on the upper substrate 180. The black matrix 182 works in a transparent OLED device to reduce reflectivity of various lines and to avoid colors from being mixed as the viewing angle is changed.

Referring to FIG. 3, the first transparent region TA1a and the second transparent region TA1b are the areas other than the emissive region EA1 in the first sub-pixel SP1. In the first transparent region TA1a and the second transparent region TA1b, no element for emitting or reflecting light is formed. Specifically, since the anode 151 including the reflective layer 154 is not formed in the first transparent region TA1a and the second transparent region TA1b, no light is generated in the organic emission layer 152 formed in the first transparent region TA1a and the second transparent region TA1b, and no light is reflected by the anode 151.

Figure 4A:
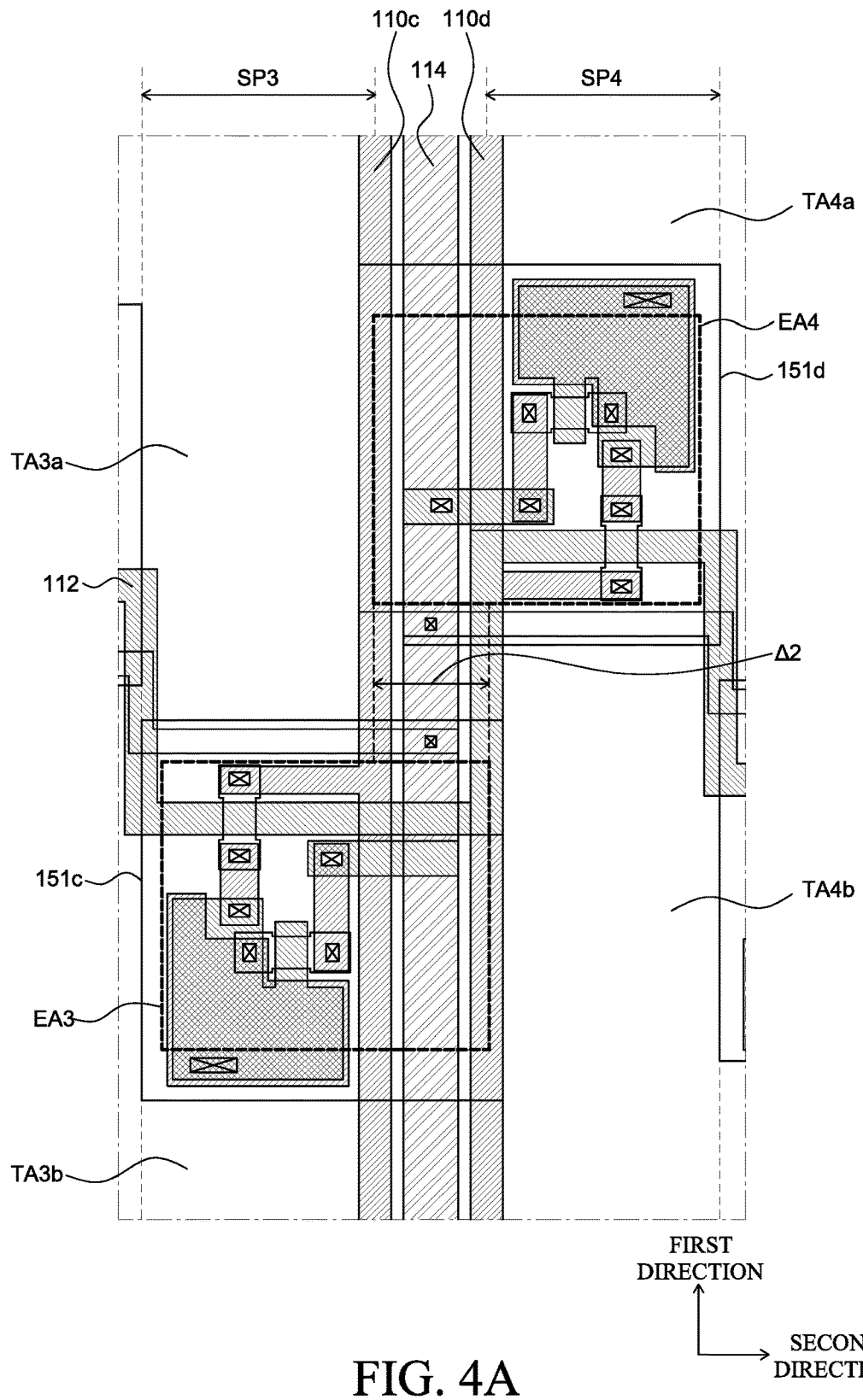
FIG. 4A is a plan view for illustrating two sub-pixels in a transparent OLED device according to another exemplary embodiment of the present disclosure.

FIG. 4A is a plan view for illustrating two sub-pixels in a transparent OLED device according to another exemplary embodiment of the present disclosure. FIG. 4 is an enlarged view of a third sub-pixel SP3 and a fourth sub-pixel SP4 adjacent to each other among the plurality of sub-pixels SPR, SPG, SPB and SPW shown in FIG. 1. Detailed description of the substantially identical elements will be omitted to avoid redundancy. Referring to FIG. 4, for convenience of illustration, only the gate line 112, the data lines 110a and 110b, a source voltage supply line 114, the switching thin-film transistor 120, the driving thin-film transistor 130 and the capacitor 159 and anodes 151a and 151b included in the transparent OLED device are depicted.

The source voltage supply line 114 may be formed between the third sub-pixel SP3 and the fourth sub-pixel SP4. That is, the source voltage supply line 114 may be formed between the data line 110c of the third sub-pixel SP3 and the data line 110d of the fourth sub-pixel SP3 and may be formed along the direction in which the data lines 110c and 110d are extended.

The source voltage supply line 114 may be electrically connected to the third sub-pixel SP3 and the fourth sub-pixel SP4. That is, the source voltage supply line 114 may be electrically connected to the emissive region EA3 in the third sub-pixel SP3 and the emissive region EA4 in the fourth sub-pixel SP4 so as to apply source voltage. Specifically, the source voltage supply line 114 may be electrically connected to the driving thin-film transistor 130 in the emissive region EA3 in the third sub-pixel SP3 and the emissive region EA4 in the fourth sub-pixel SP4.

In addition, the anode 151c of the third sub-pixel SP3 and the anode 151d of the fourth sub-pixel SP4 may be formed by extending to the area where the source voltage supply line 114 is formed or the area where the data line of an adjacent sub-pixel is formed. Specifically, the anode 151c of the third sub-pixel SP3 may be formed by extending to the area where the data line 110d of the fourth sub-pixel SP4 is formed, and the anode 151d of the fourth sub-pixel SP4 may be formed by extending to the area where the data line 110c of the third sub-pixel SP3 is formed. Accordingly, the emissive region EA3 in the third sub-pixel SP3 and the emissive region EA4 in the fourth sub-pixel SP4 may also be formed in the area where the source voltage supply line 114 is formed or the area where the data line of the adjacent sub-pixel is formed. Specifically, the emissive region EA3 of the third sub-pixel SP3 may be formed by extending to the area where the data line 110d of the fourth sub-pixel SP4 is formed, and the emissive region EA4 of the fourth sub-pixel SP4 may be formed by extending to the area where the data line 110c of the third sub-pixel SP3 is formed. That is, the source voltage supply line 114 and the data line 110d of the fourth sub-pixel SP4 may overlap the anode 151c of the third sub-pixel SP3 and the emissive region EA3 of the third sub-pixel SP3. Also, and the source voltage supply line 114 and the data line 110c of the third sub-pixel SP3 may overlap the anode 151d of the fourth sub-pixel SP4 and the emissive region EA4 of the fourth sub-pixel SP4.

Accordingly, the horizontal gap Δ2 between the emissive region EA3 in the third sub-pixel SP3 and the emissive region EA4 in the fourth sub-pixel SP4 may be equal to or even less than zero. That is, the emissive region EA3 in the third sub-pixel SP3 and the emissive region EA4 in the fourth sub-pixel SP4 are alternately staggered in the first direction, so that they do not directly overlap each other and thus color mixing does not occur. However, they may overlap each other or may come in contact with each other on the source voltage supply line 114 along the direction in which the virtual straight line VL is extended.

Since the horizontal gap Δ2 between the emissive region EA3 of the sub-pixel SP3 and the emissive region EA4 of the fourth sub-pixel SP4 adjacent to each other is not for avoiding color mixing between the emissive region EA3 of the sub-pixel SP3 and the emissive region EA4 of the fourth sub-pixel SP4. In fact, the color mixing may not occur even if the emissive region EA3 of the sub-pixel SP3 and the emissive region EA4 of the fourth sub-pixel SP4 overlap each other along the direction in which the virtual straight line VL is extended. The emissive regions EA3 and EA4 may be formed by overlapping to the area where the source voltage supply line 114 is formed and may overlap each other, thereby obtaining a larger light-emitting area. In this manner, the area of the transparent regions of the transparent OLED device can be expanded while the area of the emissive regions is maintained, so that the aperture ratio of the transparent regions can be improved.

Hereinafter, various shapes of the emissive regions will be described in detail with reference to FIGS. 4B and 4C.

Figure 4B:
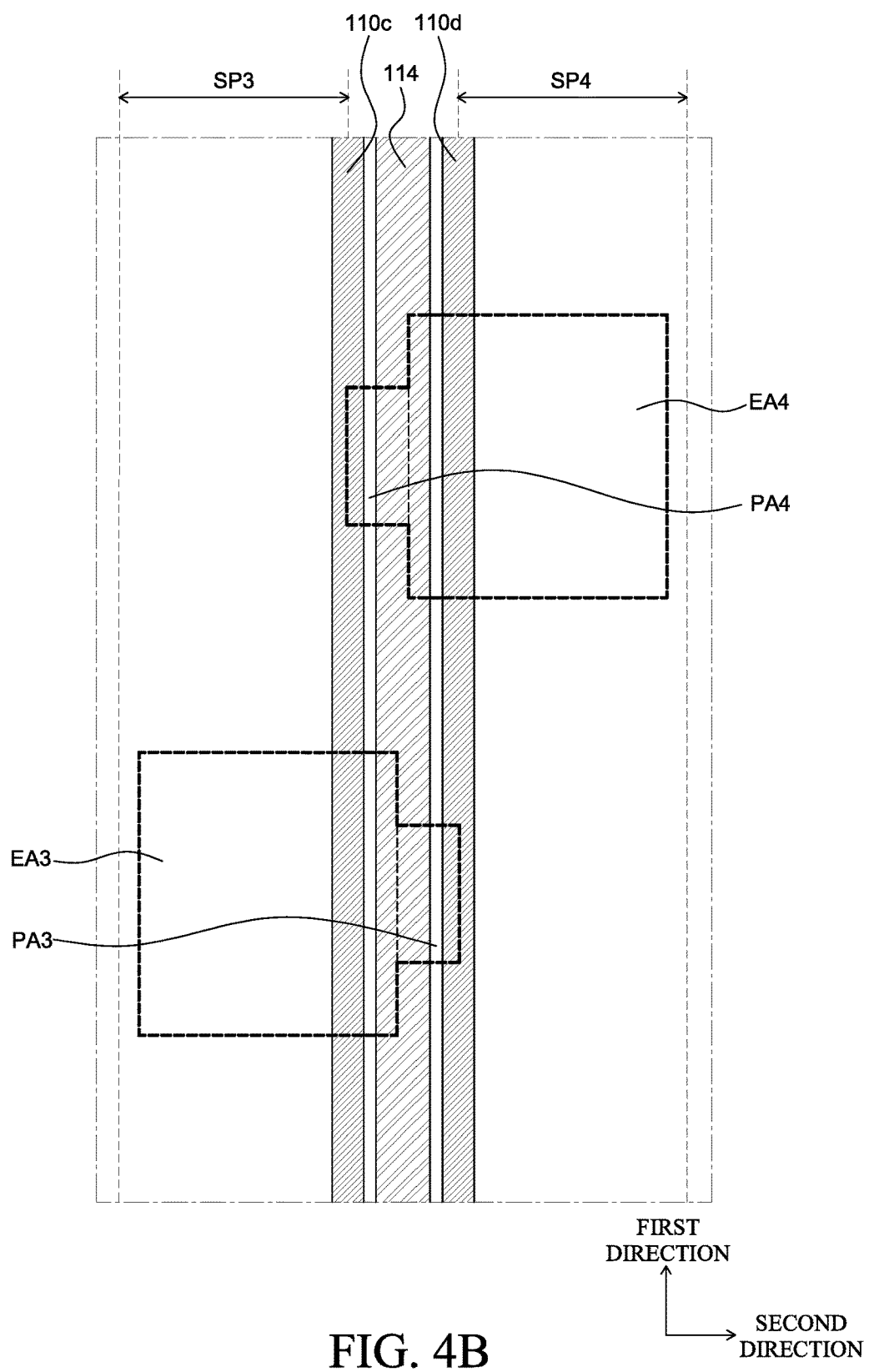
FIG. 4B is a schematic plan view for illustrating an emissive region that further includes a protruding emissive region according to yet another exemplary embodiment of the present disclosure.

FIG. 4B is a schematic plan view for illustrating an emissive region that further includes a protruding emissive region according to yet another exemplary embodiment of the present disclosure. FIG. 4C is a schematic plan view for illustrating an emissive region that has chamfered shape according to yet another exemplary embodiment of the present disclosure.

Referring firstly to FIG. 4B, a protruding emissive region PA3 comes in contact with the emissive region EA3 of the third sub-pixel SP3 and overlaps the date line 110c. In addition, a protruding emissive region PA4 comes in contact with the emissive region EA4 of the fourth sub-pixel SP4 and overlaps the date line 110d. The protruding emissive region PA3 and the protruding emissive region PA4 may also overlap the source voltage supply line 114. That is, a side of each of the emissive regions EA3 and EA4 may include a protruding portion that protrudes outwardly from the emissive regions EA3 and EA4.

If the protruding emissive region PA3 comes in contact with the emissive region EA3 of the third sub-pixel SP3, the width of the protruding emissive region PA3 with respect to the first direction is equal to or less than the width of the emissive region EA3 of the third sub-pixel SP3 with respect to the first direction. If the protruding emissive region PA4 comes in contact with the emissive region EA4 of the fourth sub-pixel SP4, the width of the protruding emissive region PA4 with respect to the first direction is equal to or less than the width of the emissive region EA4 of the fourth sub-pixel SP4 with respect to the first direction.

If the protruding emissive regions PA3 and PA4 overlap the data lines 110c and 110d, respectively, the emissive regions EA3 and EA4 can be formed also on the data lines 110c and 110d, respectively. Accordingly, the transparent regions TA3a and TA3b of the third sub-pixel SP3 and the transparent regions TA4a and TA4b of the fourth sub-pixel SP4 may be expanded by the amount equal to the area by which the emissive regions EA3 and EA4 are expanded toward the data lines 110c and 110d, respectively.

In FIG. 4B, each of the protruding regions PA3 and PA4 comes in contact with the emissive region EA3 of the third sub-pixel SP3 and the emissive region EA4 of the fourth pixel SP4, respectively. However, only one of the two protruding emissive regions PA3 and PA4 may be employed.

Figure 4C:
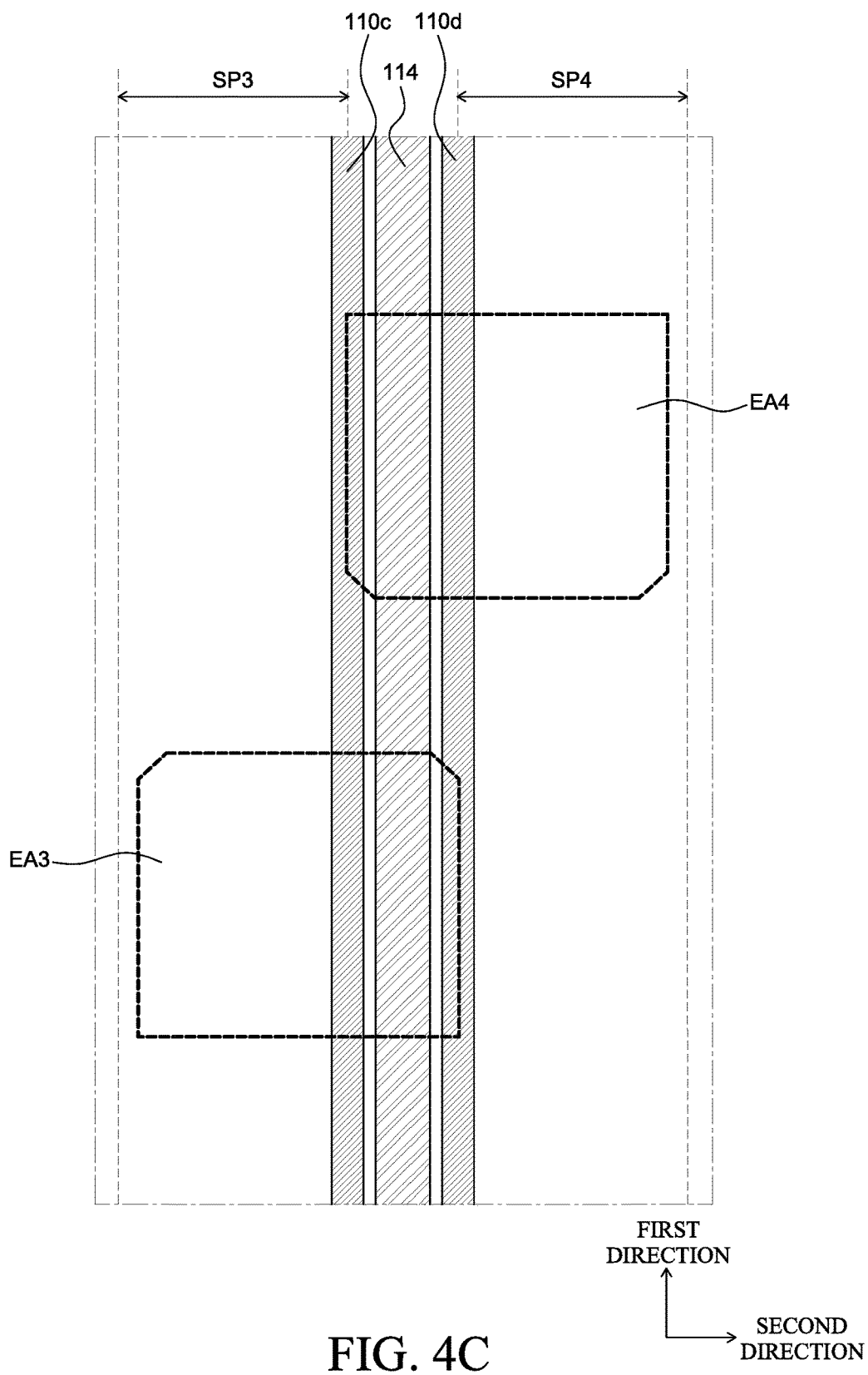
FIG. 4C is a schematic plan view for illustrating an emissive region that has chamfered shapes according to yet another exemplary embodiment of the present disclosure.

Next, referring to FIG. 4C, the emissive regions EA3 and EA4 may have a chamfered shape. For example, at least one of the four angled corners of a rectangular emissive region may be chamfered. As used herein, chamfering refers to truncating edges of a polyhedron to make them dull.

In particular, by the chamfered shapes, a distance required to avoid color mixing between the emissive region EA3 of the sub-pixel SP3 and the emissive region EA4 of the fourth sub-pixel SP4 adjacent to each other can be ensured. In other words, the chamfered shapes reduce the vertical distance between the two adjacent emissive regions EA3 and EA4. Accordingly, the shape of the emissive regions EA3 and EA4 may be determined so that the minimum spacing gap for avoiding color mixing is ensured while the area of the emissive regions EA3 and EA4 can be obtained as large as possible.

FIG. 5 is a table showing results of comparing the transmittance of a transparent OLED device according to an exemplary embodiment of the present disclosure with the transmittance of an existing OLED device. In FIG. 5, Comparative Example has the layout of emissive regions in an existing OLED device, and Embodiment has the layout of emissive regions in a transparent OLED device according to an exemplary embodiment of the present disclosure. Comparative Example has a pixel region having a red sub-pixel, a green sub-pixel, a blue sub-pixel and a white sub-pixel arranged in line with one another. In contrast, Embodiment has a pixel region having a red sub-pixel, a green sub-pixel, a blue sub-pixel and a white sub-pixel arranged in a zigzag pattern. The pixel regions in Comparative Example and Embodiment have the same area and the same aperture ratio of the emissive regions of 25%.

If the emissive regions are disposed in a zigzag pattern according to Embodiment in FIG. 5, the aperture ratio (40%) of the transparent regions in Embodiment becomes higher than the aperture ratio (20%) of the transparent regions in Comparative Example. The aperture ratio of the emissive regions of Comparative Example, i.e., 25% is equal to the aperture ratio of the emissive regions of Embodiment, i.e., 25%. Since the transmittance is proportional to the aperture ratio of the transparent regions, the transmittance of Embodiment, i.e., 20% is higher than the transmittance of Comparative Example, 10%.

Specifically, in the transparent OLED device according to Embodiment, emissive regions of sub-pixels are disposed in a zigzag pattern, so that emissive regions can be formed even in the area where various lines are formed. As a result, the area of the transparent regions can be expanded while maintaining the area of the emissive regions. Accordingly, the transparent OLED device using a zigzag pattern can achieve higher aperture ratio, say 40%, than other transparent OLED devices. That is, the area of the transparent region may be at least 25% of the area of the sub-pixel.

Figure 6:
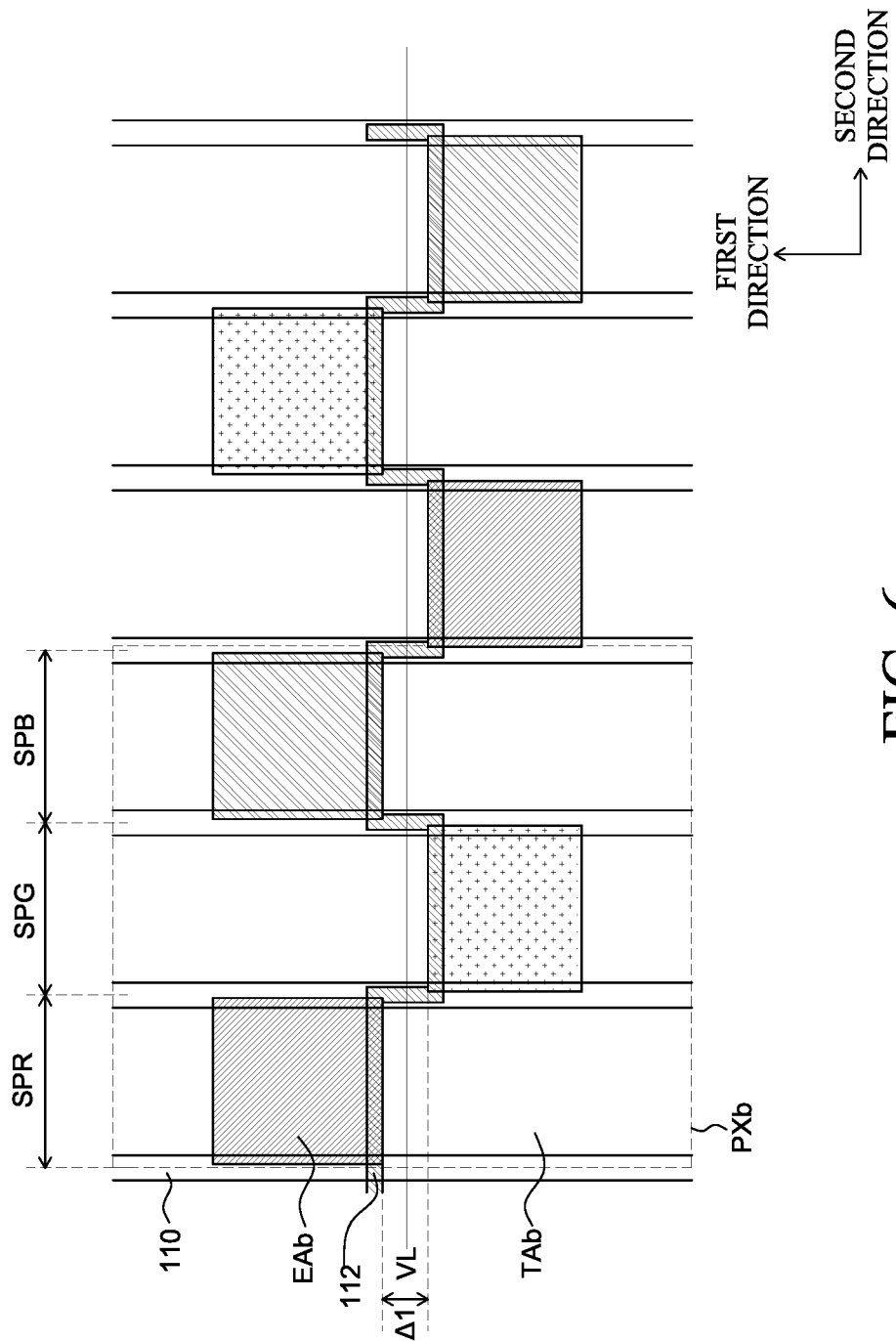
FIG. 6 is a schematic plan view for illustrating a plurality of sub-pixels of a transparent OLED device according to still another exemplary embodiment of the present disclosure.

FIG. 6 is a schematic plan view for illustrating a plurality of sub-pixels of a transparent OLED device according to still another exemplary embodiment of the present disclosure. The transparent OLED device shown in FIG. 6 is substantially identical to that shown in FIG. 1 except for the configuration of the sub-pixels SPR, SPG and SPB forming a single pixel; and, therefore, the redundant description will be omitted. For convenience of illustration, FIG. 6 shows only sub-pixels SPR, SPG and SPB, the gate line 112 and the data line 110 of the transparent OLED device.

Referring to FIG. 6, two pixel regions are depicted, and different sub-pixels SPR, SPG and SPB of a pixel region PXb emit light of difference colors. Specifically, the pixel region PXb includes three sub-pixels, i.e., a red light emitting sub-pixel SPR, a green light emitting sub-pixel SPG, and a blue light emitting sub-pixel SPB. Each of the sub-pixels SPR, SPG and SPB includes an emissive region EAb and a transparent region TAb.

The emissive region EAb and the transparent region Tab have the same structure and function as those of the transparent OLED device shown in FIG. 1.

The adjacent emissive regions EAb are spaced apart from each other by a vertical gap Δ1 in the vertical direction. The vertical gap Δ1 is determined based on a process margin required during the manufacturing a transparent OLED. Specifically, for a transparent OLED device including red, green and blue emissive regions, a process margin is required to deposit an organic emission layer in each of the emissive regions. More specifically, a process margin refers to a gap necessary for avoiding color mixing caused by the shadow effect during a process of depositing a red organic emission layer, a green organic emission layer and a blue organic emission layer. Accordingly, the vertical gap Δ1 is the minimum gap required to avoid color mixing between adjacent organic emission layers. The smaller the process margin is, the shorter the vertical gap Δ1 is.

Figure 7:
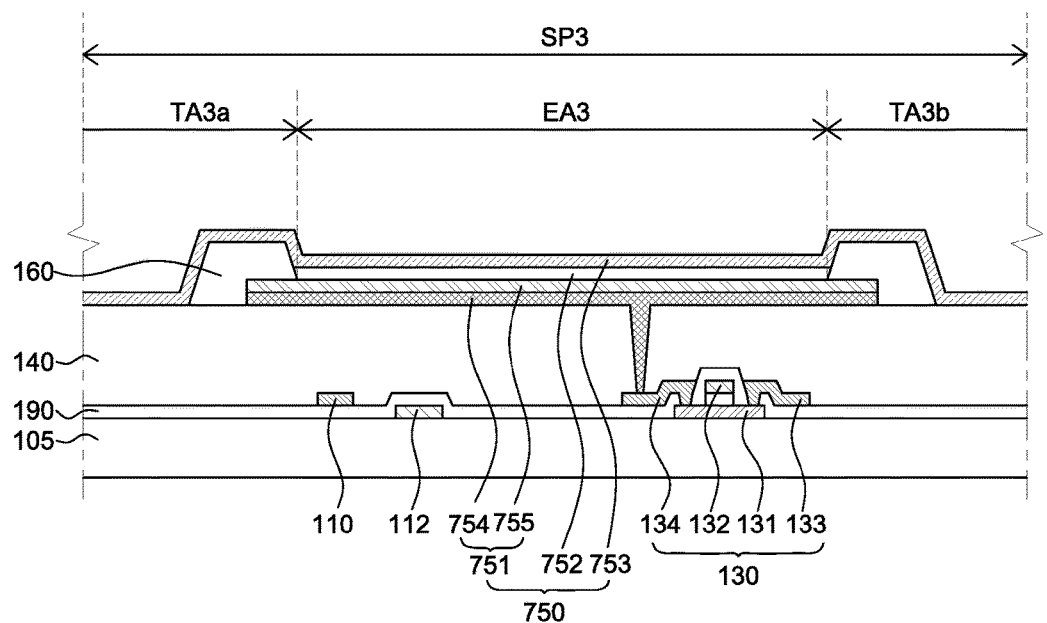
FIG. 7 is a schematic cross-sectional view of a transparent OLED device according to still another exemplary embodiment of the present disclosure.

FIG. 7 is a schematic cross-sectional plan view of a transparent OLED device according to yet another exemplary embodiment of the present disclosure. The transparent OLED device shown in FIG. 7 is substantially identical to that shown in FIG. 3 except for that the former includes a red, green or blue organic emission layer whereas the latter includes a white organic emission layer. The redundant description will be omitted. In FIG. 7, the switching thin-film transistor 120 and the capacitor 159 are not depicted for convenience in explanation.

Referring to FIG. 7, the organic light-emitting element 750 includes an anode 751, an organic emission layer 752 and a cathode 753. The organic emission layer 752 may be a red organic emission layer, a green organic emission layer or a blue organic emission layer depending on which sub-pixel it belongs to. The cathode 753 may be formed in the emissive region EA3 and also in the transparent regions TA3a and TA3b, but the organic emission layer 752 is formed only in the emissive region EA3.

The emissive region EA3 is defined by the bank layer 160. The organic emission layer 752 is deposited in the area surrounded by the bank layer 160.

Since the organic emission layer 152 generates red, green or blue light on its own, the transparent OLED device including the red, green and blue organic emission layers does not require the sealing element 170, the upper substrate 180, the color filter 181 and the black matrix 182. Accordingly, the transparent OLED device can be thinner.

Thus far, exemplary embodiments of the present disclosure have been described in detail with reference to the accompanying drawings. However, the present disclosure is not limited to the exemplary embodiments, and modifications and variations can be made thereto without departing from the technical idea of the present disclosure. Accordingly, the exemplary embodiments described herein are merely illustrative and are not intended to limit the scope of the present disclosure. The technical idea of the present disclosure is not limited by the exemplary embodiments. The scope of protection sought by the present disclosure is defined by the appended claims and all equivalents thereof are construed to be within the true scope of the present disclosure.

What is claimed is:

1. A transparent organic light-emitting display (OLED) device, comprising:
    a first sub-pixel including a first transparent region, a second transparent region, and a first emissive region between the first transparent region of the first sub-pixel and the second transparent region of the first sub-pixel, wherein the first transparent region, the first emissive region, and the second transparent region are disposed along a first direction;
    a second sub-pixel including a first transparent region, a second transparent region and a second emissive region between the first transparent region of the second sub-pixel and the second transparent region of the second sub-pixel, wherein the first transparent region of the second sub-pixel, the second emissive region, and the second transparent region of the second sub-pixel are disposed along the first direction, and the second sub-pixel is adjacent to the first sub-pixel in a second direction, and
    a gate line including a first portion overlapping a part of the first emissive region, a second portion overlapping a part of the second emissive region, and a third portion connecting the first portion with the second portion,
    wherein the first emissive region and the first transparent region of the first sub-pixel are disposed in line with the first transparent region of the second sub-pixel in the second direction, and the second emissive region and the second transparent region of the second sub-pixel are disposed in line with the second transparent region of the first sub-pixel in the second direction,
    wherein the first transparent region of the first sub-pixel and the first transparent region of the second sub-pixel are disposed continuously, and the second transparent region of the first sub-pixel and the second transparent region of the second sub-pixel are disposed continuously,
    wherein the first emissive region and the second emissive region are disposed on opposite sides with respect to a straight line passing through a center of the first sub-pixel and a center of the second sub-pixel in the second direction, and
    wherein a portion of the second transparent region of the first sub-pixel is disposed between the first emissive region and the straight line, and a portion of the first transparent region of the second sub-pixel is disposed between the second emissive region and the straight line so that the first emissive region and the second emissive region are spaced apart from the straight line by the portion of the second transparent region of the first sub-pixel and the portion of the first transparent region of the second sub-pixel, respectively.

2. The transparent OLED device of claim 1, wherein the first portion of the gate line and the second portion of the gate line extend in the second direction, and the third portion of the gate line extends in the first direction.

3. The transparent OLED device of claim 1, wherein the first portion of the gate line overlaps a lower end of the first emissive region and the second portion of the gate line overlaps an upper end of the second emissive region, and the first portion of the gate line and the second portion of the gate line are disposed on opposite sides with respect to the straight line.

4. The transparent OLED device of claim 3, wherein the second portion of the gate line overlaps a data line disposed between the first sub-pixel and the second sub-pixel and extended along with it.

5. The transparent OLED device of claim 1, wherein a total area-of the first transparent region and the second transparent region of the first sub-pixel is-equal to or more than 25% of an area of the first sub-pixel, and a total area of the first transparent region and the second transparent region of the second sub-pixel is equal to or more than 25% of an area of the second sub-pixel.

6. The transparent OLED device of claim 1, wherein the first transparent region of the first sub-pixel and the second transparent region of the second sub-pixel are disposed on opposite sides with respect to the straight line, and the second transparent region of the first sub-pixel and the first transparent region of the second sub-pixel are disposed on opposite sides with respect to the straight line.

7. The transparent OLED device of claim 1, wherein the first emissive region is substantially surrounded by the first transparent region of the first sub-pixel and the second transparent region of the first sub-pixel, and the first transparent region of the second sub-pixel.

8. The transparent OLED device of claim 1, wherein the first emissive region is spaced apart from the second emissive region by a distance to reduce color mixing with light emitted from the second emissive region.

9. The transparent OLED device of claim 1, wherein a thin-film transistor and an organic light-emitting element are disposed in the first and the second emissive region respectively, and wherein the organic light-emitting element includes an anode, an organic emission layer and a cathode.

10. The transparent OLED device of claim 9, wherein the anode comprises a reflective layer and a transparent conductive layer on the reflective layer.

11. The transparent OLED device of claim 9, wherein the organic emission layer is a white organic emission layer, and the OLED device further comprises a color filter corresponding to the first and the second emissive region.

12. The transparent OLED device of claim 1, wherein each sub-pixel includes only one emissive region and two transparent regions.

13. The transparent OLED device of claim 1, wherein the first emissive region is expanded in the second direction to correspond to a width of the first sub-pixel, and the second emissive region is expanded in the second direction to correspond to a width of the second sub-pixel, so that the aperture ratio of the first transparent region of the first sub-pixel, the second transparent region of the first sub-pixel, the first transparent region of the second sub-pixel and the second transparent region of the second sub-pixel can be improved.

* * * * *